United States Patent [19]
Palfrey et al.

[11] Patent Number: 4,911,516
[45] Date of Patent: Mar. 27, 1990

[54] OPTICAL DEVICE WITH MODE SELECTING GRATING

[75] Inventors: Stephen L. Palfrey, Metuchen; Michael Ettenberg, Freehold, both of N.J.; Victor Korsun, Melrose Park, Pa.

[73] Assignee: General Electric Company, Schenectady, N.Y.

[21] Appl. No.: 316,209

[22] Filed: Feb. 27, 1989

[51] Int. Cl.⁴ ............................................... G02B 6/34
[52] U.S. Cl. .............................. 350/96.19; 350/96.13; 350/96.15
[58] Field of Search ............... 350/96.12, 96.13, 96.15, 350/96.16, 96.19, 96.29, 96.30

[56] References Cited

U.S. PATENT DOCUMENTS

| 4,067,642 | 1/1978 | King et al. ........................ 350/96.19 |
| 4,156,206 | 5/1979 | Comerford et al. ......... 350/96.19 X |
| 4,198,117 | 4/1980 | Kobayashi ........................ 350/96.19 |
| 4,760,569 | 7/1988 | Mahlein ........................ 350/96.19 X |
| 4,786,132 | 11/1988 | Gordon ........................... 350/96.19 |

OTHER PUBLICATIONS

"Fibre Bragg Reflector For Mode Selction And Line--Narrowing Of Injection Lasers", by E. Brinkmeyer et al., Electronics Letters, 30th Jan. 1986, vol. 22, No. 3, pp. 134–135.
"Single-Wavelength Operation Of The Hybrid-External Bragg-Reflector-Wave Guide Laser Under Dynamic Conditions", by J. M. Hammer et al., Applied Physics Letter 4/(3), 1 Aug. 1985, pp. 183–185.

Primary Examiner—John D. Lee
Attorney, Agent, or Firm—Paul R. Webb, II; James C. Davis, Jr.

[57] ABSTRACT

An optical fiber has a beveled end surface and a Bragg reflector grating formed on the end surface to form a single mode reflector for a semiconductor laser. A transmission fiber with a beveled end is fused to the beveled grating to form a continuous transmission line having an internal reflective grating.

15 Claims, 2 Drawing Sheets

OPTICAL DEVICE WITH MODE SELECTING GRATING

This invention relates to diffraction gratings in combination with optical fibers.

The use of diffraction gratings with a single mode optical fiber is highly desirable for a number of applications such as wavelength stabilization of laser diodes and optical pulse compression. In the former case, wavelength stabilization has been demonstrated using a grating to provide frequency selective feedback to a laser diode. This has been done using Bragg gratings on waveguides and fibers and with discrete refraction gratings. Placing a grating on a fiber is believed especially important because the wavelength-stabilized output is contained in the fiber which can be directly incorporated into optical systems. The difficulty with the fiber approach, however, is how to produce the grating in a controlled, reproducible fashion.

One example of single wavelength operation of a hybrid external Bragg reflector waveguide laser is disclosed in an article entitled "Single-wavelength operation of the hybrid-external Bragg-reflector-waveguide laser under dynamic conditions" by J. M. Hammer et al. Applied Physics Letter 47 (3), 1 Aug. 1985, pp. 183-185. In this article, an RCA constricted-double-heterostructure large-optical cavity (CDH LOC) diode laser is butt-coupled to a two-dimensional waveguide containing a Bragg reflecting grating. The relative position and angles of the laser and waveguide are adjusted by precision mechanical stages. This arrangement is shown in FIG. 1 of the article on page 184. The Bragg reflecting grating is located at the stripe-phosphorus-glass interface on a silicon nitride stripe loaded phosphorus glass waveguide. However, in this arrangement, the waveguide is spaced from the diode laser. Such a spacing introduces optical coupling inefficiencies. Further, the waveguide needs to be coupled to a transmission medium such as an optical fiber ot the like and this results in further coupling inefficiencies.

In an article entitled "Fibre Bragg Reflector For Mode Selection and Line-narrowing of Injection Lasers" by E. Brinkmeyer et al., in Electronics Letters, 30th Jan. 1986, Vol. 22, No. 3, pp. 134-135, an optical fiber is disclosed having a grating formed thereon. A commercially available index-guided laser diode with a single-mode-fiber pigtail is fusion-spliced or butt-coupled to a reflector fiber, which serves as the output fiber. The reflector is prepared by embedding a fiber section into a silica block and side polishing the fiber to the vicinity of its core. Then, a fine surface relief grating is formed in a photoresist layer on the polished surface. However, in practice, this structure has met with little success. It is believed that this structure is sensitive to the position of the grating relative to the core region, is difficult to fabricate and is not believed commercially viable. While suitable for laboratory experiment, it is not believed this arrangement is practical for a commercial application due to the criticalness of the nature of the grating relative to the fiber core.

An optical light transmissive device according to the present invention including a mode selecting grating comprises an optical light transmissive member having an optical axis extending in a given direction along which axis light is substantially propagated. A mode selecting light reflecting grating is formed in the member on a surface thereof inclined relative to and intersecting the optical axis to reflect the light propagating within the member. The so-reflected light has a given wavelength extent as determined by the reflecting grating.

In accordance with one aspect of the invention, the reflective grating is formed on an inclined optical fiber surface and a second fiber having an inclined surface is fused to the grating to form a continuous optical fiber with an inclined reflective grating within the fiber body.

Figure 1:
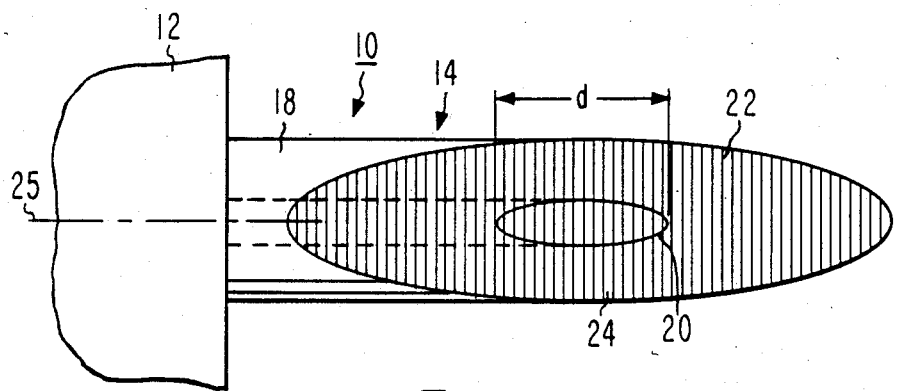
FIG. 1 is plan view of an optical fiber device in accordance with one embodiment of the present invention.
Figure 2:
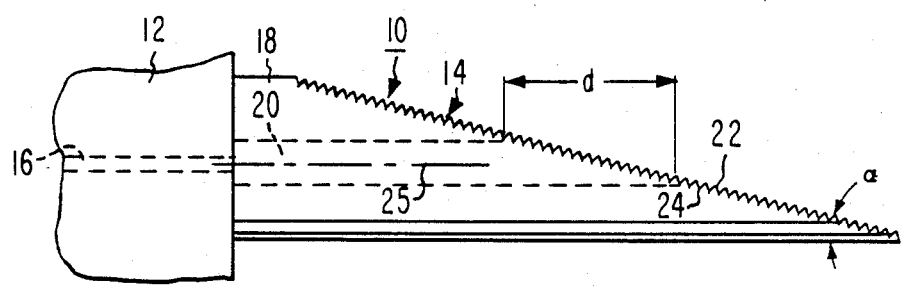
FIG. 2 is a side elevation view of the device of the embodiment of FIG. 1.

In FIGS. 1 and 2, system 10 includes a laser semiconductor diode 12 butt coupled to an optical fiber 14. The diode 12 is of conventional construction whose details need not be given herein. The diode emits a beam from its active region 16 which beam normally without fiber 14 has multi-modes. As known, it is desirous to reduce the modes of the diode output beam to a single mode for enhancing the operation of the laser. To this end, prior art systems employ separate Bragg reflectors for converting the multi-modes of a diode to a single mode operation. The aforementioned articles mentioned in the introductory portion are examples of some of the attempts of the prior art for achieving this aim. Still other structures are widely known and used for this purpose. As mentioned in the introductory portion, the problems with all of these prior art systems is the additional coupling inefficiencies introduced by separate gratings which need to be coupled to the diode and the need for coupling the gratings to optical fibers.

The optical fiber 14 of FIGS. 1 and 2 has a cladding 18 and a core 20. The cladding 18 and core 20 have different indices of refraction to provide a light guiding core region. The fiber 14 is butt coupled to the diode 12 to couple the emitted beam from the active region 16 to the fiber. In an alternate structure, the end of the fiber 14 may be coupled by a spherical lens to the emitted beam of the diode. However, regardless which structure is used to couple the fiber 14 to the diode 12, the fiber 14 includes a reflective Bragg grating 22 for converting the emitted beam of diode 12 to a single mode or multiple modes, as the case may be, for a given implementation. The grating 22 is formed on a surface 24 of the fiber 14 inclined relative to the fiber optical axis 25. The surface 24 is inclined at an angle $\alpha$ to axis 25, which angle is preferably in the range of about 1°-5° in this embodiment. The grating 22 is formed in the fiber directly on the end of the fiber as shown.

Figure 5:
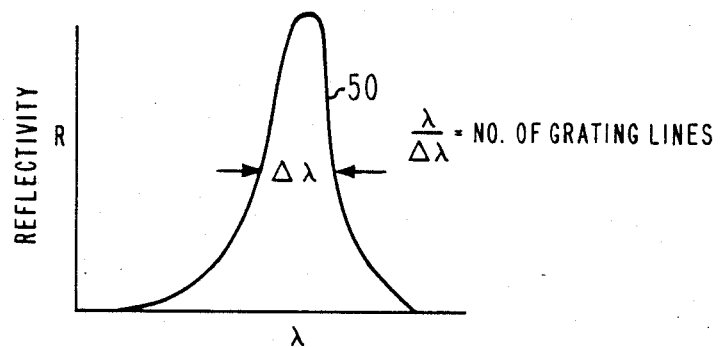

In FIG. 5, the response characteristics of the grating is shown by curve 50. The spectral width of the reflectivity $\Delta\lambda$ of the grating shown by curve 50 is a function of the number of grating lines that the propagated light beam is responsive to. For example, the number of grating lines for producing the curve 50 is given approximately by the relationship $\lambda/\Delta\lambda$. The specific value of $\Delta\lambda$ selected and the corresponding value of the number of grating lines is determined by a given implementation. For example, the requirements will depend on the laser gain characteristics in a specific embodiment. For optimum single mode operation, it is known that the narrower the curve 50, the better the single mode operation. Therefore Δλ should be as small as possible. Given the number of grating lines to produce Δλ, as given by the relationship above, it can be shown that for a given wavelength λ the relative number of grating lines for producing a desired narrow curve 50 is relatively large.

Conventional wisdom would provide a grating directly on an end of a fiber which end is normal to the direction of propagation, i.e., the optical axis of the fiber. The present inventors recognize, however, that to produce a grating on the end of the fiber normal to the axis is inadequate. This is due to the relatively small diameter of the core, measured in microns, which would result in an insufficient number of grating lines on the normal fiber end to satisfy the relationship needed to produce the desired relatively narrow width of curve 50.

Figure 4:
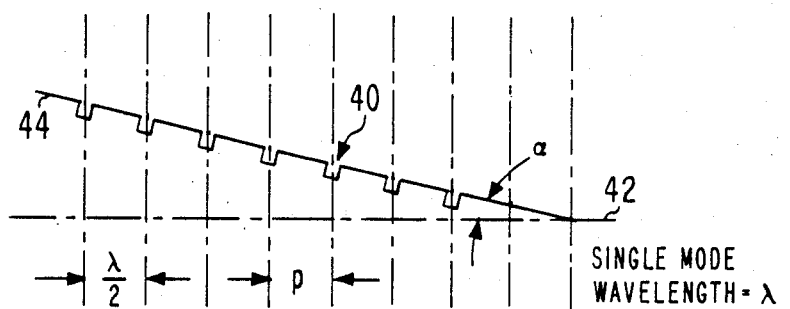
FIGS. 4 and 5 are diagrams useful for explaining certain principles of the present invention employing the grating of the embodiments of FIGS. 1-3.

In FIG. 4, applicants recognize that by inclining a grating 40 relative to an optical axis 42 along which light is propagated, the grating has a period p which is projected onto axis 42. That period p is set for a single mode operation at λ/2. Therefore, the period of the grating 40 on the inclined surface 44 is set to produce a period of λ/2 for a given desired λ. The angle α is given a value to provide the desired number of grating elements to meet the characteristics of the resultant curve 50, FIG. 5. As mentioned above, the angle α lies in the range of 1°–5° to produce the desired number of grating lines for mode selectivity in an optical fiber of a core diameter of, for example, 10 microns.

By way of example, fiber 14 has an end thereof polished with a beveled surface 24 which tapers at a desired angle α. If the grating period is 3000 angstroms and the fiber core has a diameter of 6 μm then angle α should have a value of 1° to obtain a 1000 grating lines across the fiber core 20. That is, in FIG. 1 in the region d, assuming core 20 has a diameter of 6 μm, there are 1000 lines of the grating 22 across the core 20. With α at a value of 1°, the distance d of the core region is approximately 350 microns.

The grating is formed on the polished fiber end surface 24 in a number of different possible ways. Some of these ways are:

(1) formation of a photo resist mask by holographic exposure, followed by wet chemical or dry etching of the fiber surface 24;

(2) direct electron beam writing on the glass surface 24;

(3) deposition of a thin metal film to form the grating by evaporation of a film followed by removal of lines of the metal to form the grating structure;

(4) the same as procedure (3) above except using a dielectric film instead of metal. Upon formation of the grating on the polished beveled end surface, the optical fiber will appear as fiber 14, FIGS. 1 and 2. This structure will result in the grating forming a single wavelength cavity in combination with the diode 12 for enhancing the operation of the diode.

However, it is also desirous to couple the diode 12 to an optical fiber for transmitting the light to an external receiver while still employing the grating 22 of FIGS. 1 and 2 for creating a single mode reflection cavity with the diode 12.

Figure 3:
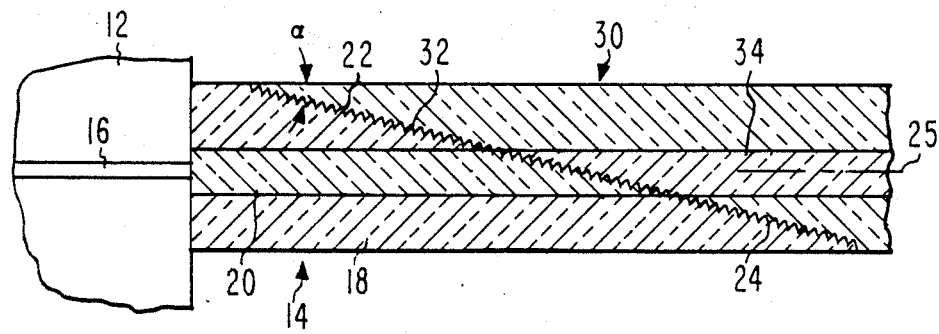
FIG. 3 is a side elevation sectional view of a device with an additional optical fiber having an inclined surface fused to the grating of the device of the embodiment of FIG. 2.

In FIG. 3, diode 12 is coupled to fiber 14 constructed as shown in FIG. 1. Fiber 30 is fused to the fiber 14. Fiber 30 has an end surface 32 which is fused to the grating 22. The end surface 32 is formed at angle α identical to angle α of FIG. 2 for forming a continuous optical fiber with the fiber 14. The core 34 of fiber 30 optical axis is aligned with the optical axis of core 20 to form one substantially continuous optical axis for the two fibers. The fiber 30 is fused to the fiber 14 using conventionally known fusing techniques. Steps of course, would have to be taken to preserve the grating during the fusing process. For example, the use of thin films of metal or dielectric to form the grating, as discussed above, would leave residual discontinuities in the dielectric constant after fusing. Fiber 30 may also be bonded using bonding materials or other structures as known in this art for joining glass fibers. Anti-reflection (AR) coatings may be employed in combination with the grating 22 for achieving further mode selection in accordance with a given implementation.

While the grating 22 has been described herein for the purpose of single mode operation, the grating 22 may be used in combination with different periods across the inclined surface of the fiber to provide multiple modes or partial mode operation as may be desired in a given implementation. The particular values of the index of refraction of the core 20 and the cladding 18 are not significant as the grating 22, FIGS. 1 and 2, will operate using known optical relationships regardless of the values of those indices. Also, the values of the wavelengths of the beams emitted by diode 12 may be selected in combination with the number of lines of gratings and the period and diameter of the optical fibers to achieve a desired effect. The different values of the diode emitted beam wavelengths and processes for fabricating the diode and the fiber may use any of the known procedures employing the grating reflector of the present embodiment. What is significant is that the grating reflector may be employed on the end of a fiber or other optical or transmitting medium on an inclined surface for achieving single or multiple mode operation in accordance with a desired implementation.

Additional optical transmitting media may be fused or otherwise joined to the grating structure to provide an optical transmission media for the non-reflective wave. Optical coatings may be employed at the interface of the wedge region for further restricting or characterizing the transmitted and reflected waves. While a particular application disclosed herein employs the optical grating in combination with a laser diode it should be understood that other applications for such gratings as known in the art could be used with an inclined surface as described herein. The particular embodiment described herein therefore is to be constructed as illustrative rather than limiting.

What is claimed is:

1. An optical fiber construction with a mode selecting grating comprising:

a single mode light transmitting fiber core member having a first index of refraction and first and second ends, said core member having an optical axis along which light is propagated;

a light transmitting fiber cladding surrounding said core member and having a second index of refraction different than the first index of refraction to form a first light transmitting fiber with said core member;

said core member and cladding tapering toward one of said ends and inclined relative to said optical axis to form a surface inclined at a given angle relative to said optical axis, said inclined surface including a reflective grating formed therein for reflecting incident light from said core member back to said core member, said reflected light having a given wavelength extent determined by said grating.

2. The optical fiber of claim 1 wherein said grating has a certain period projected onto said axis, said projected period corresponding to said given wavelength extent.

3. The optical fiber of claim 1 wherein said given angle is in the range of about 1° to 5°.

4. The optical fiber of claim 1 further including a second fiber having a tapered end which tapers relative to its optical axis at said given angle and means for abutting the tapered ends of said first and second fibers to form a substantially continuous fiber containing said inclined reflective grating internal said continuous fiber.

5. The optical fiber of claim 1 further including a semiconductor laser device having a beam emitting region and means for coupling the other of said ends of said core member to the beam emitting region wherein said grating forms an optical cavity with said device for light of said given wavelength extent.

6. An optical fiber device comprising:
a semiconductor laser having a light emitting end face;
a single mode optical fiber coupled to said end face for receiving the light emitted by said laser along a fiber optical axis; and
a Bragg reflector grating formed in the fiber and inclined relative to said optical axis for forming a laser cavity, said reflector grating including means for reflecting light of a given wavelength extent determined by said grating.

7. The device of claim 6 wherein said grating is inclined at an angle in the range of about 1° to 5° relative to said optical axis.

8. The device of claim 6 wherein said reflector grating is disposed between first and second abutting optical fibers.

9. A direct coupled external Bragg reflector optical fiber device comprising:
a semiconductor laser having a light emitting region at a surface thereof; and
a single mode optical fiber optically coupled to said surface at said region for receiving laser emitted light along a fiber optical axis, said fiber including a wavelength reflecting grating inclined in the range of about 1° to 5° to said axis and having a grating period such as to reflect light of substantially a given wavelength in a direction along said optical axis.

10. The device of claim 9 further including an additional optical fiber with an inclined end face abutting and secured to said grating to form a substantially continuous fiber containing an inclined grating within the body of said continuous fiber.

11. The device of claim 10 wherein said additional fiber is fused to said grating.

12. An optical light transmissive device with a wavelength selecting grating comprising:
a single mode optical light transmissive member having an optical axis extending in a given direction along which axis light is substantially propagated; and
a wavelength selecting light reflecting grating formed in the member on a surface thereof inclined relative to and intersecting said optical axis to reflect light propagating within the member, said reflected light having a given wavelength extent determined by said grating.

13. The device of claim 12 wherein said member inclined surface has a given area, said reflecting grating being transverse said optical axis on a portion of said given inclined area.

14. The device of claim 12 wherein the projected period of said grating in a direction parallel to said axis is one half said given wavelength extent.

15. A Bragg reflector optical fiber comprising:
a single mode optical fiber for propagating light along an optical axis; and
a Bragg reflector for reflecting a portion of said propagating light, said portion being of a given wavelength extent, said Bragg reflector being formed in said fiber inclined relative to and intersecting said axis.

* * * * *